US006531332B1

(12) United States Patent
Shkel et al.

(10) Patent No.: US 6,531,332 B1
(45) Date of Patent: Mar. 11, 2003

(54) SURFACE MICROMACHINING USING A THICK RELEASE PROCESS

(75) Inventors: Andrei M Shkel, Irvine, CA (US); Michael J Little, Oak Park, CA (US)

(73) Assignee: Parvenu, Inc., Westlake Village, CA (US)

( * ) Notice: Subject to any disclaimer, the term of this patent is extended or adjusted under 35 U.S.C. 154(b) by 0 days.

(21) Appl. No.: 09/756,860

(22) Filed: Jan. 10, 2001

(51) Int. Cl.$^7$ .................... H01L 21/00; H01L 21/76; H01L 21/4763
(52) U.S. Cl. .................... 438/50; 438/422; 438/619
(58) Field of Search .................... 438/50, 51, 52, 438/53, 421, 422, 619; 205/118

(56) References Cited

U.S. PATENT DOCUMENTS

| | | | | |
|---|---|---|---|---|
| 5,190,637 A | * | 3/1993 | Guckel | 205/118 |
| 5,822,110 A | | 10/1998 | Dabbaj | |
| 5,870,518 A | * | 2/1999 | Haake et al. | 385/90 |
| 5,908,719 A | * | 6/1999 | Guckel et al. | 430/5 |
| 6,220,561 B1 | * | 4/2001 | Garcia | 248/487 |
| 6,267,469 B1 | * | 7/2001 | Silverbrook | 347/54 |
| 6,297,072 B1 | * | 10/2001 | Tilmans et al. | 438/106 |
| 6,323,982 B1 | * | 11/2001 | Hornbeck | 359/224 |
| 6,341,039 B1 | * | 1/2002 | Flanders et al. | 359/578 |

OTHER PUBLICATIONS

Joost C. Lotters et al., "Polydimethylisiloxane as an elastic material applied in a capacitive accelerometer"; (1996); J. Micromech. Microeng. 6 (1996) pp. 52–54.

P. Bley; "Polymers–an Excellent and Increasingly Used Material for Microsystems"; Sep. 1999; SPIE vol. 3876; pp. 172–184.

Thorbjorn Ebeforst et al.; "New small radius joints based on thermal shrinkage of polyimide in V–grooves for robust self–assembly 3D microstructures"; J. Micromech. Microeng. 8 (1998); pp. 188–194.

M Pedersent et al.; "A capacitive differential pressure sensor with polyimide diaphragm"; J. Micromech. Microeng. 7 (1997); pp. 250–252.

Frank Niklaus et al.; "Low–temperature full wafer adhesive bonding"; J. Micromech. Microeng. 11 (2001); pp. 100–107.

Kenji Suzuki et al.; "Insect–Model Based Microrobot with Elastic Hinges"; Journal of Microelectromechanical Systems, vol. 3, No. 1, Mar. 1994; pp. 4–9.

K. Minami et al.; "Fabrication of Distributed Electrostatic Micro Actuator (DEMA)"; Journal of Microelectromechanical Systems, vol. 2, No. 3, Sep. 1993; pp. 121–127.

(List continued on next page.)

*Primary Examiner*—John F. Niebling
*Assistant Examiner*—Viktor Simkovic
(74) *Attorney, Agent, or Firm*—Fleshner & Kim, LLP

(57) ABSTRACT

A hybrid process combines a thin-film surface micromachining process such as by sputtering, evaporation or chemical vapor deposition with a thick-film surface micromachining and release process such as dry-film lamination. Such combination results in thin film micro-structures with all the benefits of surface micromachining without the typical problems of stiction and limited range of motion.

18 Claims, 12 Drawing Sheets

OTHER PUBLICATIONS

Cheol–Hyun Han et al.; "Parylene–Diaphragm Piezoelectric Acoustic Transducers"; The Thirteenth Annual International Conference on Microelectromechanical Systems; (2000), pp. 148–152.

Krzysztof A R B Pietraszewski et al.; "Cryogenic servo–stabilised Fabry–Perot Interferometer for imaging at 2–2.5microns"; SPIE Proceedings, vol. 2814 (1996); pp. 139–146.

T R Hicks et al.; "The application of capacitance micrometry to the control of Fabry–Perot etalons"; J. Phys. E. Instrum., vol. 17, 1984, pp. 49–55.

P. Tayebati et al.; "Widely Tunable Fabry–Perot filter Using Ga(Al)As–AlO$_x$ Deformable Mirrors"; IEEE Photonics Technology Letters, vol. 10, No. 3, Mar. 1998; pp. 394–396.

P. Tayebati et al.; "Microelectromechanical tunable filters with 0.47nm linewidth and 70nm tuning range"; Electronics Letters; Jan. 8, 1998; vol. 34, No. 1; pp. 76–78.

M.C. Larson et al.; "Vertical Coupled–Cavity Microinterferometer on GaAs with Deformable–Membrane Top Mirror"; IEEE Photonics Technology Letters, vol. 7, No. 4, Apr. 1995; pp. 382–384.

K. Aratani et al.; "Process and Design Considerations for Surface Micromachined Beams for a Tunable Interferometer Array in Silicon"; Proc. IEEE Micro Electro Mechanical Systems, Ft. Lauderdal, FL, 1993, pp. 230–235.

MEM–Tune Tunable Filter; Preliminary Data Sheet; May 2000.

OPM–1 Optical Performance Monitor; Preliminary Data Sheet; May 2000.

GTM–1 EDFA Gain–Tilt Monitor; Preliminary Data Sheet; May 2000.

J. H. Jerman et al.; "Miniature Fabry–Perot Interferometers Micromachined in Silicon for Use in Optical Fiber WDM Systems"; Transducers '91, International Solid–State Conference on Sensors and Actuators, pp. 372–375 (1991) IEEE, pp. 472–475.

P. Tayebati; "Microelectromechanical tunable filter with stable haft symmetric cavity"; Electronics Letters–IEEE, 1998, p. 1967.

* cited by examiner

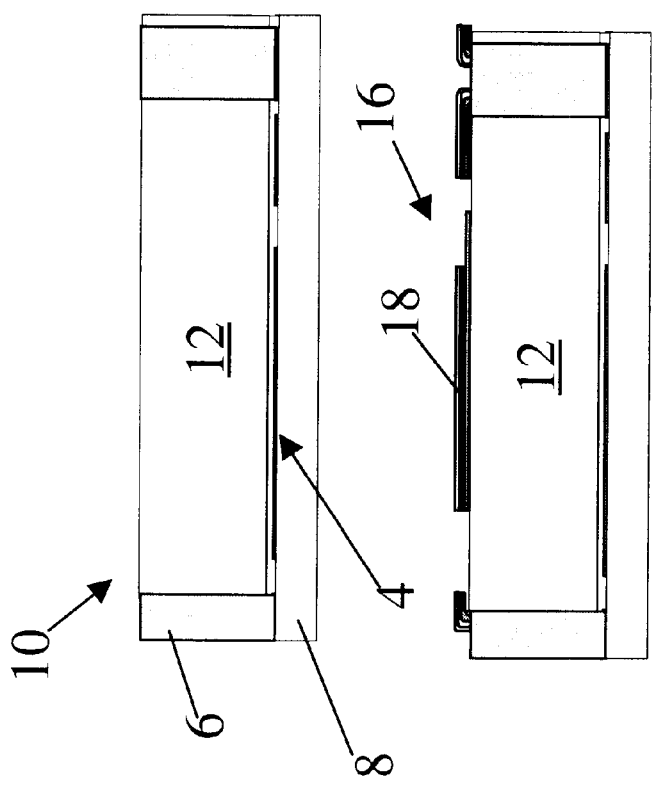

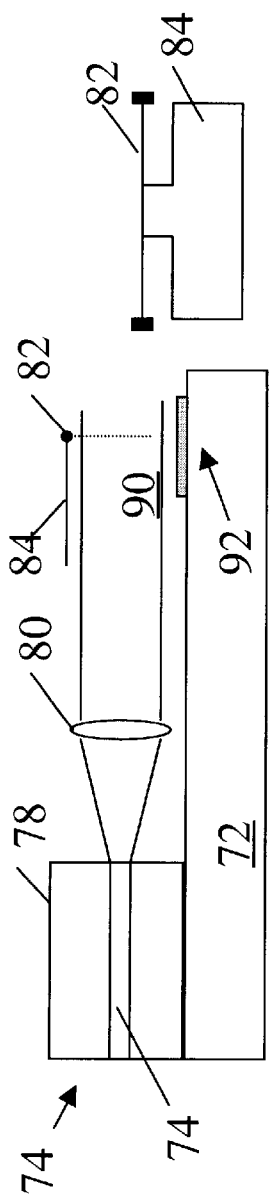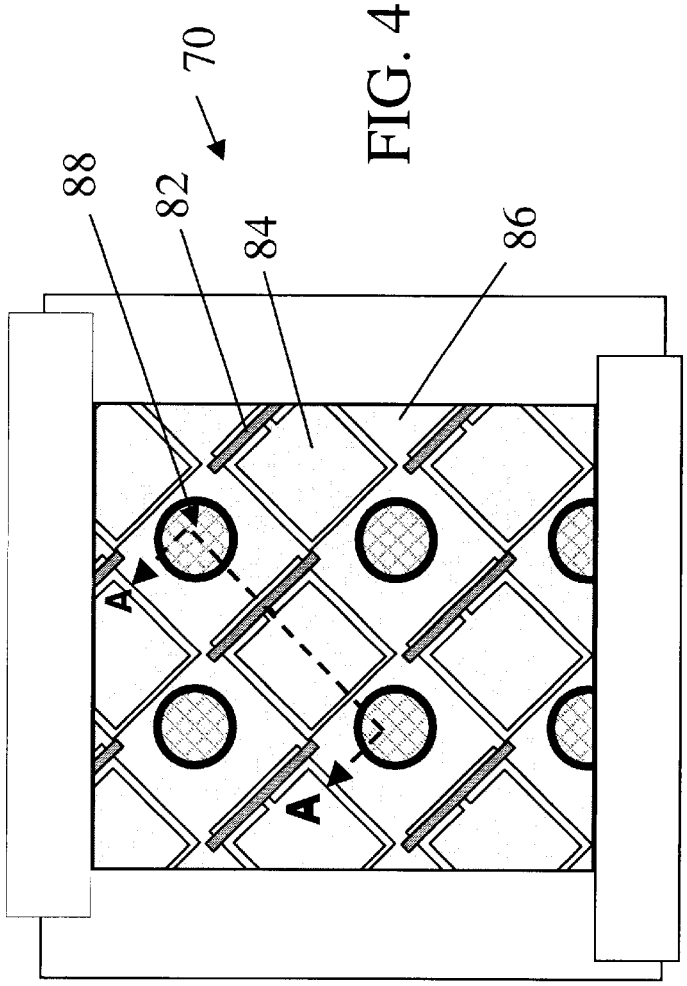
FIG. 3
FIG. 4

Need thick release

SURFACE MICROMACHINING USING A THICK RELEASE PROCESS

BACKGROUND OF THE INVENTION

1. Field of the Invention

This invention relates to the fabrication of MicroElectro-Mechanical Systems (MEMS) devices and more specifically to a hybrid fabrication technique in which MEMS devices are formed using thin-film surface micromachining on a thick release process.

2. Description of the Related Art

MEMS is a relatively new technology, which exploits the existing microelectronics infrastructure to create complex machines with micron feature sizes. These machines have both electrical and mechanical components and can have many functions including sensing, communication and actuation. MEMS are useful because they are physically small and can be very precise.

MEMS fabrication can be separated into two classes: bulk micromachining which is a subtractive fabrication that converts the substrate into the mechanical parts of the MEMS device and surface micromachining which is an additive technique that involves building the device on the surface of the substrate. Surface micromachining is further refined into classic thin film processes in which the release layer and devices are constrained to no more than a few microns and electroplating-based processes such as LIGA in which the devices can be tens to hundreds of microns thick. LIGA processing forms a high aspect ratio mold on the surface of the substrate, which is subsequently filled with metal using electroplating techniques, resulting in thick metal structures built right on the surface of the substrate.

Classic thin film surface micromachining, historically originated from the semiconductor industry, is an additive fabrication technique which involves the building of a device, layer by layer, on top of the surface of a supporting substrate (e.g., a single crystal silicon wafer). The nature of the deposition processes involved, e.g., low-pressure chemical vapor deposited (LPCVD) and thermal oxidation, restricts practical layer thicknesses to no more than a few microns. These small vertical dimensions, i.e. height, may be a drawback for some devices and an advantage for others. The materials used for fabrication of layers of surface micromachining devices include doped and undoped polysilicon, silicon nitride, for the electrical and mechanical structures, and silicon dioxide, as a release material; and aluminum and gold alloys for the metal connections to the outside world.

In case of surface micromachined structures built on a silicon substrate, silicon dioxide is classically used as a release material, and is grown thermally. For example, a silicon wafer is placed in a water vapor ambient at 1000 degrees Celsius for 1 hour, which converts 0.3 microns of the silicon surface into 0.6 of silicon dioxide. Thermal oxide thickness is limited to a few microns due to the diffusion of water vapor through silicon dioxide. Silicon dioxide can be deposited without modifying the surface of the substrate, but this process is impractical due to the excessively long deposition time and the film is highly stressed. The result is films limited to 4 microns or less. Silicon nitride may also be used as a release material, but since its deposition process is the same, its thickness is also limited to the same range.

Many combinations of possible structural material and sacrificial layer can be, and have been, tried; examples are combinations of silicon nitride and polysilicon, gold and titanium, nickel and titanium, polyimide and aluminum, tungsten and silicon dioxide, and aluminum and polymer. The majority of the surface micromachining work has, however, focused on the combination of polysilicon as the structural material and silicon dioxide or related glasses as the sacrificial material.

Thin film surface micromachining is particularly well suited to forming very thin structures. Using special fabrication techniques low stress micro-structures can be obtained. As such thin film processing is preferred to form (1) actuators that have low voltage compliance and (2) sensors that must be able to respond to very small signals. Thin film processes have also aggressively explored for optical MEMS applications such as switches for all-fiber telecommunication networks. For many applications, however, the primary drawback of conventional surface micromachining technology is the limitation imposed by the height of the release layer (4 microns maximum). Such close proximity of devices to the substrate often results in stiction, which is a serious problem in these applications, and the design space is quite limited.

A separate approach in surface micromachining is to build tall structures, sometimes with high-aspect ratios. One method of this approach is LIGA, which is the German acronym for X-ray lithography (X-ray LIthographie), electrodeposition (Galvanoformung), and molding (Abformtechnik). The process involves a conductive substrate, a thick layer of X-ray resist (microns to millimeters,), high-energy X-ray radiation exposure and development to arrive at a three-dimensional resist structure. Subsequently, electroplating fills the vacant areas of the resist mold with a metal and, after resist removal, a free-standing metal structure results. The metal shape may be a final product or serve as a mold for precision plastic injection molding. Injection-molded plastic parts may in turn be final product or lost molds. Tiny (meso-scale) magnetic motors and precision-engineered gears are typical applications for the LIGA process. LIGA is not generally applicable to form sensors, actuators and optical devices because of the poor surface flatness of the thick layer, often surface height variations are larger that the thickness of the thin device structures required.

A family of LIGA-like processes enables movable microstructures. The ability to make movable LIGA devices is enabled by an addition of a thin sacrificial layer, between wafer substrate and the thick layer of LIGA resist. This allows the molding process to fabricate thick structures either partially attached or freely suspended slightly above the substrate. The sacrificial layer may be polyimide, silicon dioxide, polysilicon, or some other metal. Thus, this LIGA-like technology enables thick freely moving structures (thick thanks to the laminated film and freely moving credited to the underlying thin release layer).

Bulk micromachining is a subtractive fabrication that converts the substrate into the mechanical parts of the MEMS device. As such, the fabrication of a broader class of tall structures is easier than with classic surface micromachining. This is because the substrates can be thick resulting in relatively thick unsupported devices. Packaging of bulk micromachined devices tends to be more difficult than packaging surface micromachined devices. Furthermore, the removal (etching away) of thick layers of the substrate bulk does not easily lend itself to the controlled fabrication of very thin low stress structures required for low voltage operation that might be obtained with surface micromachining techniques.

SUMMARY OF THE INVENTION

In view of the above problems, the present invention provides a technique for monolithic fabrication of low voltage, IC compatible MEMS devices with the capability for low stress thin surfaces in a manner that expands the design space to include low voltage actuation and large out-of-plane actuation. Additionally, the proposed technology solves one of the drawbacks of surface micromachining, namely stiction yield, by eliminating physical contact of the device with the substrate. Furthermore, moving the devices away from the substrate reduces parasitic capacitance.

This is accomplished with a hybrid process that combines a thin-film surface micromachining process such as by sputtering, evaporation or chemical vapor deposition with a thick-film surface micromachining and release process such as lamination. Such combination results in thin film microstructures, with all the benefits of surface micromachining that are significantly distant from the substrate.

The thick-film process forms a base on which the thin film devices are fabricated. The base comprises a thick release layer patterned in an appropriate manner to define a post array formed by, for example, electroplating or some other compatible process. The thin-film surface micromachining process then forms a device or devices on top of the thick base that, when released, are supported by the posts high above the underlying substrate. The thin film surface micromachining process may or may not involve an additional release layer. However, if an additional release layer is employed, a low temperature polymer based process is preferred to maintain compatibility with the thick-film process and, if used, IC wafer.

In one particular embodiment, the hybrid process includes the following steps:

(a) Preparing the substrate with patterned or unpatterned conductive layers;

(b) Laminating and then patterning a dry film to form the thick release;

(c) Electroplating the device to form the posts in the patterned areas of the dry film;

(d) Forming a MEMS device on top of the thick release supported by the posts; and (e) Releasing the dry film.

Furthermore, due to the low temperature nature of this process the MEMS devices can be monolithically fabricated on top of an IC wafer. The IC wafer may be preprocessed using thin-film technology to form actuation electrodes or other electrical components on its surface. This hybrid process is particularly well suited for applications such as optical switches, scanners, sensors and actuators that could benefit from an increased range of motion.

These and other features and advantages of the invention will be apparent to those skilled in the art from the following detailed description of preferred embodiments, taken together with the accompanying drawings, in which:

BRIEF DESCRIPTION OF THE DRAWINGS

FIGS. 1a through 1c illustrate a simplified hybrid process in accordance with the present invention;

FIG. 3 is a simplified schematic of an optical switch;

FIG. 4 is a plan view of the optical switch;

DETAILED DESCRIPTION OF THE INVENTION

Figure 2A:
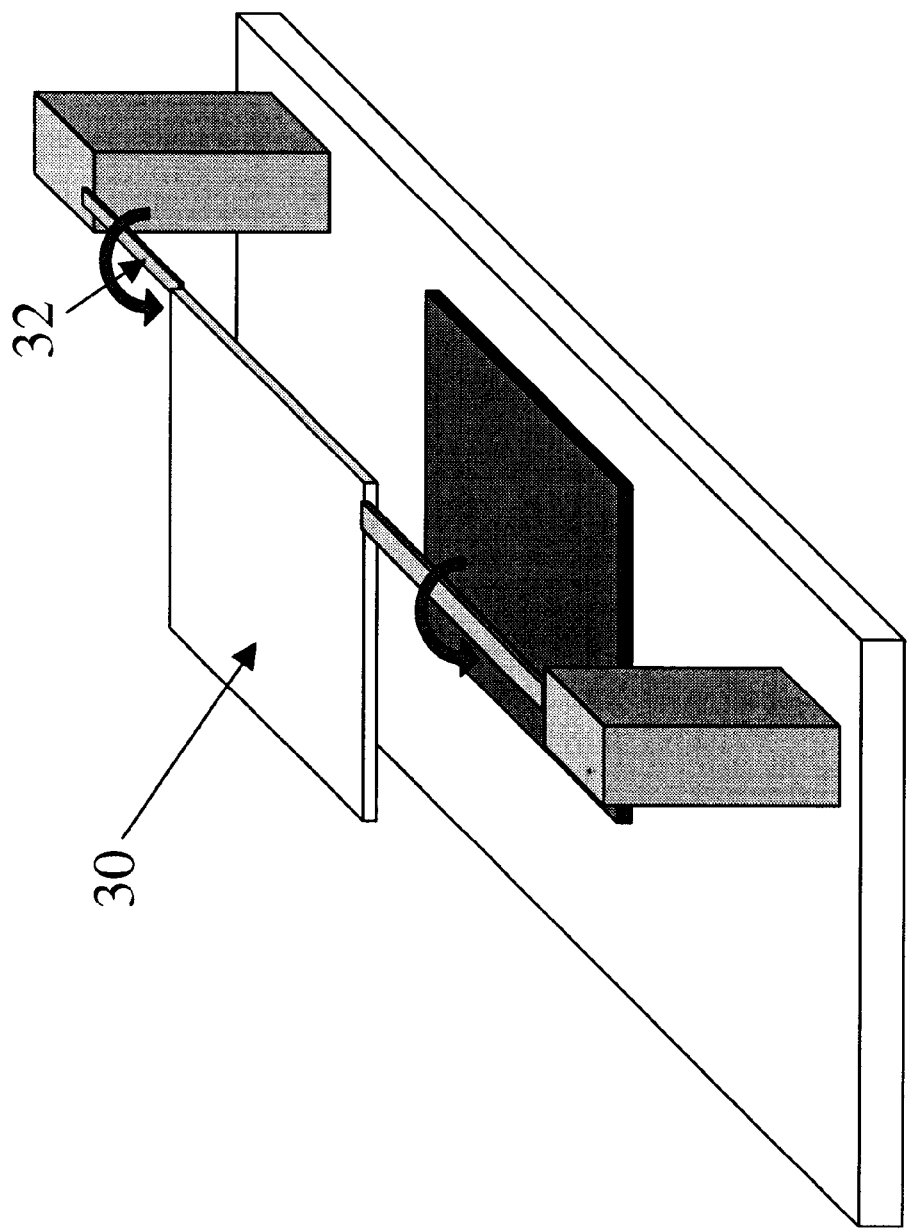
FIGS. 2a and 2b are simplified illustrations of an optical MEMS device and a MEMS sensor, respectively, formed using the hybrid process detailed in FIG. 1.

The present invention provides a technique for monolithic fabrication of low voltage, IC compatible MEMS devices with the capability for low stress optically flat surfaces in a manner that expands the design space to include excellent (low) voltage compliance, large aspect ratios and/or large out-of-plane actuation and eliminates stiction, i.e. physical contact of the device with substrate. This technique facilitates the replacement of multiwafer design and assembly. Monolithic fabrication will greatly improve precision and lower cost.

As depicted in FIGS. 1a through 1c, this is accomplished with a hybrid process that combines a thick-film deposition and electrodeposition with a thin-film surface micromachining process. In many applications, a separate thin-film process will be used to first form electrodes 4 on the substrate 8. The thick-film process forms a base 10 on which the thin film devices are then fabricated (FIG. 1a). The base comprises a thick release layer 12 patterned in an appropriate manner to define post array 6 formed by, for example, electroplating or some other compatible process. The thin film surface micromachining process then forms a device or devices 16 (FIG. 1b) on the base that, when released, are supported by the posts high (10s to 100s of microns) above the underlying substrate 8 (FIG. 1c). The thin film surface micromachining process may or may not involve an additional thin release layer. However, if an additional release layer is employed, a low temperature polymer based process is preferred to maintain compatibility with the thick-film process. In many applications, the thick release will be at least 10 microns and the thin film structures at most 3 microns. Standard thin-film deposition uses one of evaporation, sputtering or chemical vapor deposition processes.

As is evident in FIG. 1c, thin-film device 16 is supported high above substrate 8, much higher than would be possible with traditional thin-film surface micromachining processes. As compared to other monolithic approaches, this allows device 16 to be designed in such away as to take advantage of the much greater aspect ratio. In particular, the device 16, as shown in FIG. 1c, may include a mechanical component 18 that can move through a full range of motion, e.g. 90 degrees counter clockwise, without touching the surface of the substrate. This eliminates the danger of stiction, which is the primary yield issue associated with MEMS devices and may significantly improve device isolation from any parasitic capacitance between the device and substrate.

Figure 2B:
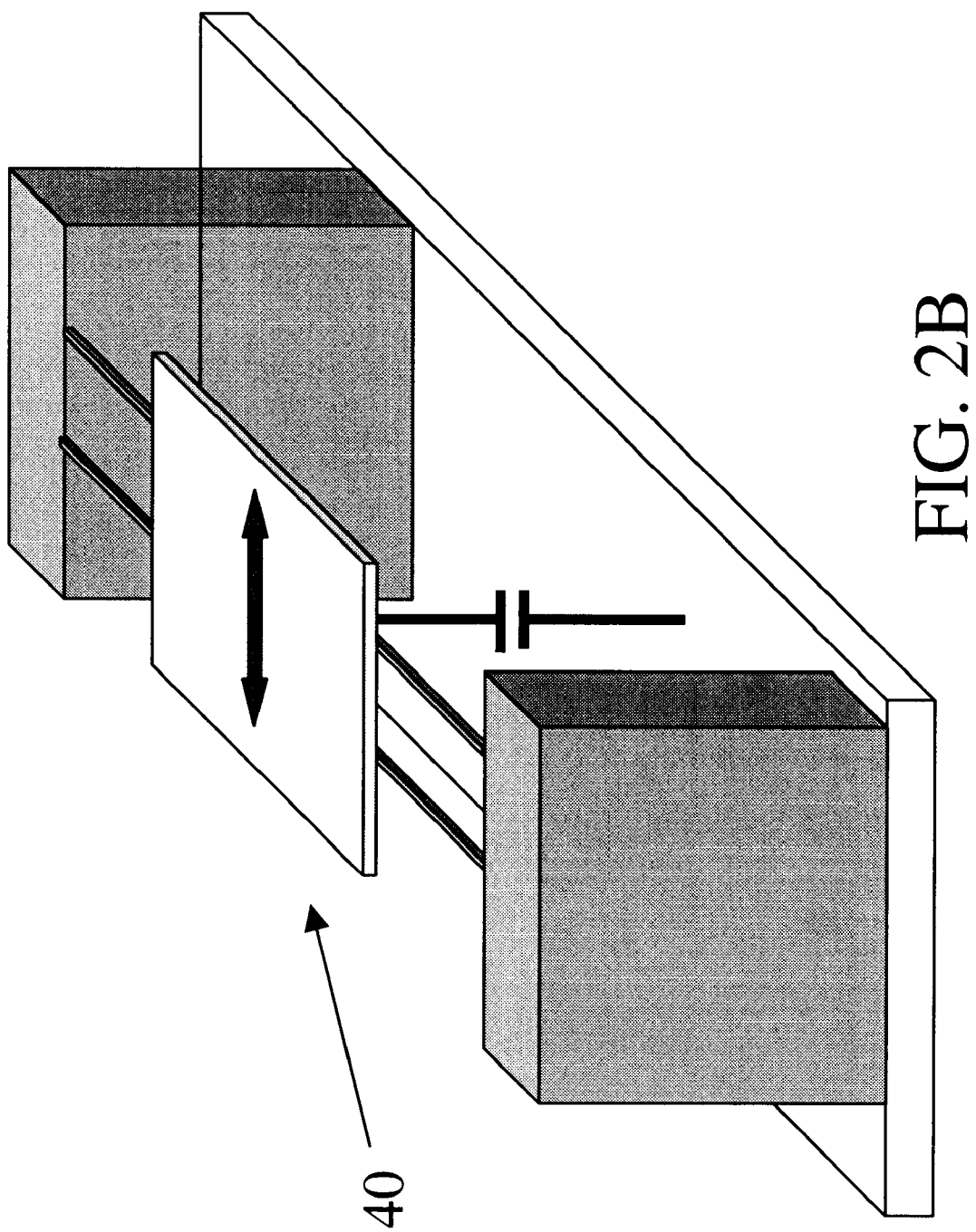

Specific applications include, but are not limited to, optical MEMS in which a mirror 30 is rotated about a hinge 32 to deflect light such as in switches or scanners (FIG. 2a). The mirror can rotate a full 90 degrees without stiction problems. Certain sensors 40 may also benefit for a greatly enhanced range of motion, the reduction in parasitic capacitance to the substrate may greatly enhance sensor sensitivity (FIG. 2b). As compared to multiwafer assembled approaches, the hybrid monolithic approach will greatly improve precision and reduce cost by avoiding wafer alignment and bonding processes.

By way of example and without loss of generality, an example of a specific hybrid process for a particular MEMS application (an optical switch 70 as shown in FIGS. 3, 4 and 5) is described in FIGS. 6a through 6i.

As shown in FIG. 3, the optical switch is built on a single substrate 72. An optical device 74 such as a fiber is mounted on substrate 72. Fibers include a core 76 along which the beam travels and an outer cladding 78, which is much thicker than the core. For example, the outer cladding may be 125-500 microns compared to 5-10 microns for the core.

The fiber is mounted on the substrate in such a manner to control the height of the light as it travels over the substrate. This is typically done using grooves to lower the optical paths but the fiber could just as well be raised on a pedestal. Light emitted from fiber 74 diverges until it is intercepted by a lens 80, which collimates the beam and directs it to the mirror array along an input optical path. Another optical device is similarly mounted on the substrate in an orthogonal relationship to receive the beam of light along the output optical path.

As illustrated in FIG. 3, a mirror hinge 82 is positioned above the optical paths at the intersection of the input and output optical paths such that an undeflected mirror 84 does not intercept the light beam as it travels to and from the switch. The mirror and mirror hinge are defined within a frame 86 supported on the array of posts 88 (see FIG. 4). The posts are carefully positioned on the substrate not to interfere with the optical paths. The array of posts and frame bound a cavity 90 between the mirrors and the substrate to allow deflection of the mirrors into the optical paths. Since the mirrors are held at reference potential by way of a conductive path through the posts to reference electrodes on the substrate, the application of voltage(s) to control electrodes 92 (unitary, latched, tapered or split) produces an electrostatic force that rotates mirror 84 about its hinge 82 to an approximately vertical position in cavity 90 to intercept the optical path and deflect the beam of light. As illustrated, the beam hits the top surface of the mirror. Alternately, the fibers could be oriented such that the beam hits the bottom surface of the mirror. The dimensionality of the array and the particular application will determine the precision with which the mirror must be deflected and maintained, which in turn will dictate the electrode configuration and addressing scheme. Because the optical switch is designed and fabricated monolithically the hinges and control electrodes are precisely aligned, which in turn improves deflection accuracy.

Figure 5A:
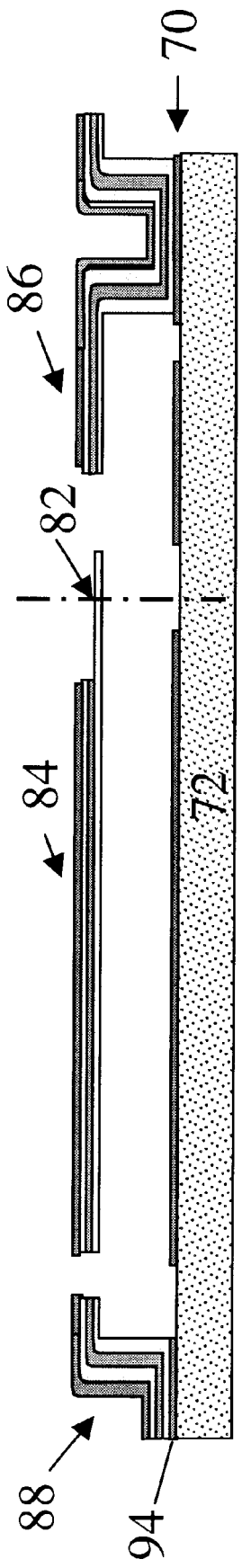
FIGS. 5a and 5b are sectional views taken along section lines A—A and B—B, respectively, in FIG. 4.
Figure 5B:
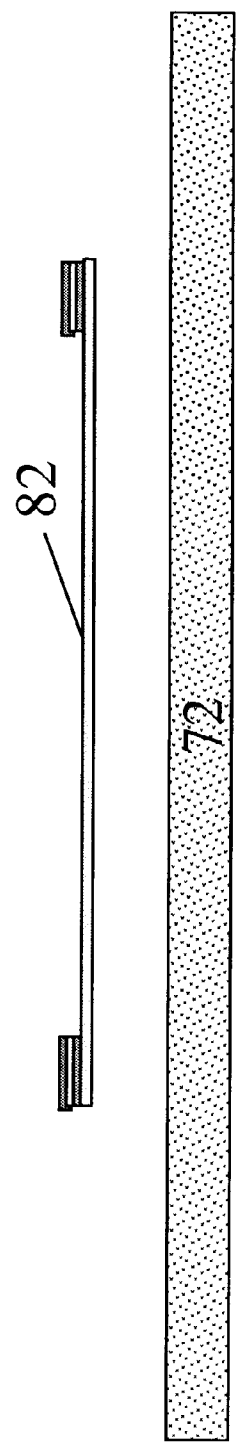

FIGS. 4 and 5a-5b illustrate a presently preferred physical implementation of the monolithic 2D optical switch 70 in which the mirror hinge 82 is positioned above the optical paths as illustrated in FIG. 3. FIG. 4 is a plan view of the implementation and FIGS. 5a and 5b are sectional views taken through the mirror 84 and posts 88 orthogonal to the hinge 82 and through the hinge 82, respectively. Control and reference electrodes 92 and 94, respectively, are positioned on substrate 72 underneath mirrors 84 and posts 88, respectively. Posts 88 support a frame 86 that together support the mirrors above the optical paths and bound cavity 90 between the array of mirrors and substrate. Posts 88 are oriented at 90° with the respect to the hinges out of the optical paths and provide a conductive path between reference electrodes 94 and the mirrors so that the mirrors can be held at a reference potential. Frame 86 supports mirror hinges 82, defines openings for the mirrors and generally provides structural stability to the mirror array. As configured, mirrors 84 lie in the plane of frame 86 above the optical paths. When a sufficient voltage is applied; between a mirror and its control electrode, the mirror rotates about its hinge 82 under the influence of the electrostatic field between the mirror and its control electrode by approximately ninety degrees into the optical path to deflect the optical signal to the second optical device.

Optical switch 70 is suitably formed with the hybrid MEMS fabrication of the present invention as follows:

(1) Provide Substrate: The substrate 72 can be of any material since the subsequent processes are additive and do not modify (or etch into) the substrate and are low temperature, e.g. less than 130° Celsius. This includes metals, ceramics, or plastics and includes IC wafers. Note, conventional MEMS processes (sputtering, evaporation, CVD) that deposit a release layer are not practicable for tall structures. In order to deposit thick enough films in a reasonable amount of time would require high temperature processing (greater than 350 degrees Celsius). This would cause the silicon ICs and aluminum traces to form an alloy thereby shorting out the ICs.

Figure 6A:
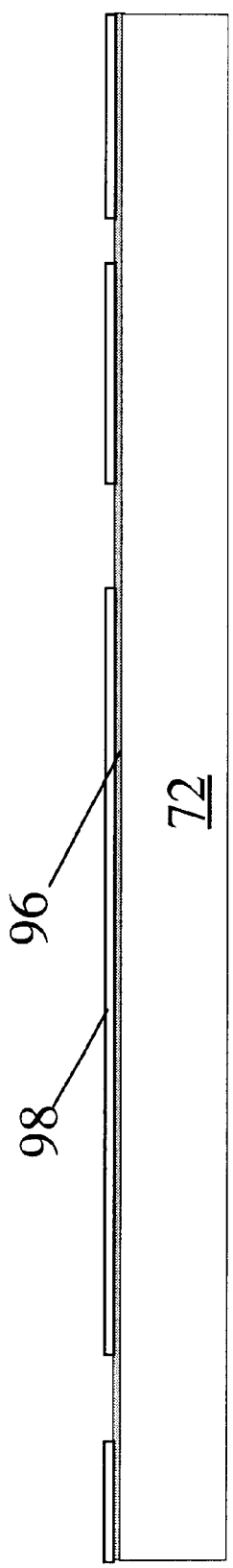
FIGS. 6a through 6i illustrate a particular hybrid process for forming the optical switch of FIG. 3 in accordance with the present invention.
Figure 6B:
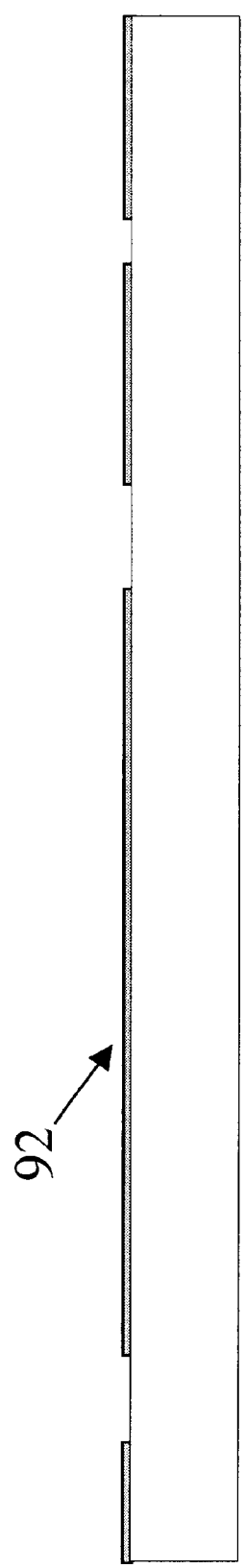

(2) Pattern electrode layer: As shown in FIG. 6a, an electrode layer 96 and a patterned photoresist 98 are applied to substrate 72 using conventional photolithography techniques. Electrode layer 96 is then patterned using photoresist 98 as a mask to define electrodes 92 as shown in FIG. 6b. The electrodes will perform the function of the cathode in the subsequent electroplating process in place of the seed layer normally deposited on the wafer.

Figure 6C:
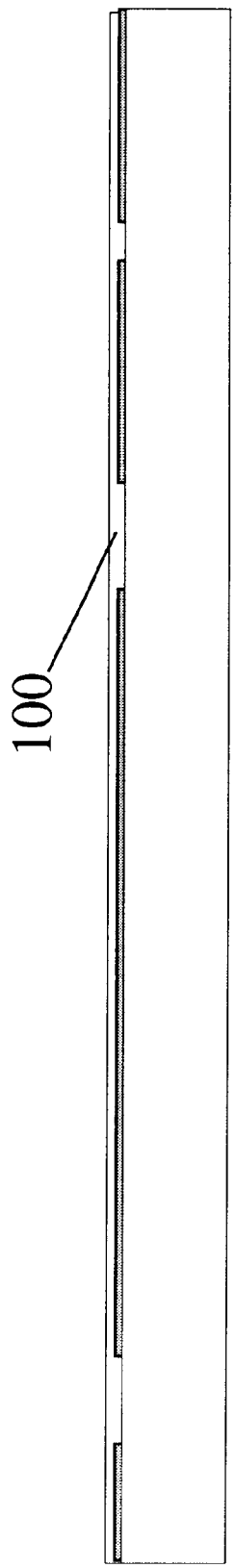
Figure 6D:
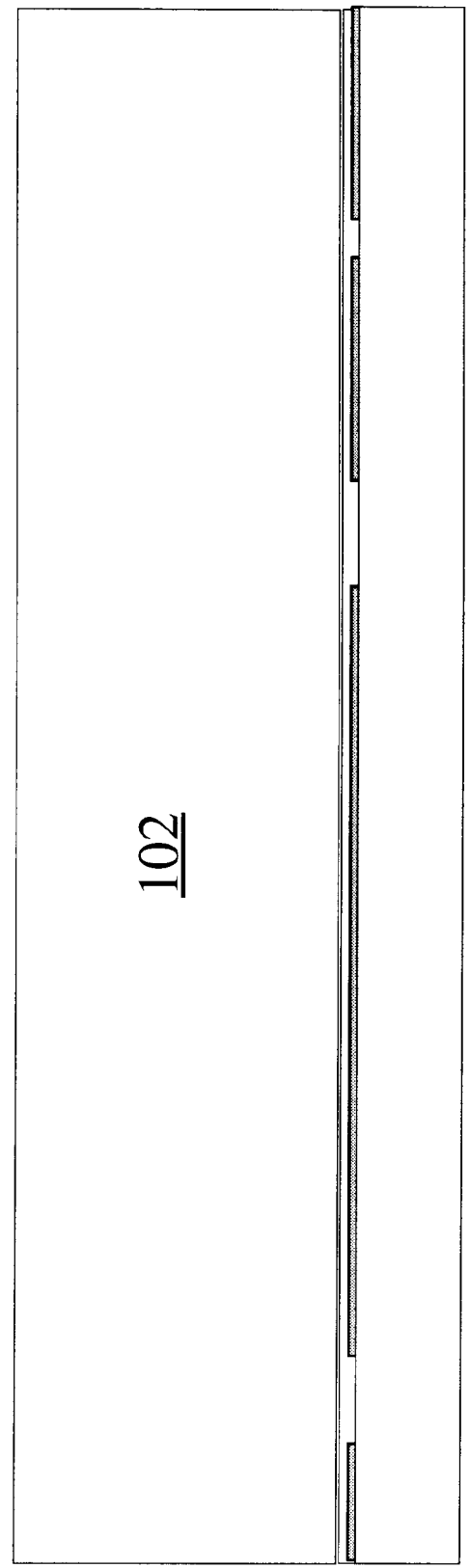
Figure 6E:
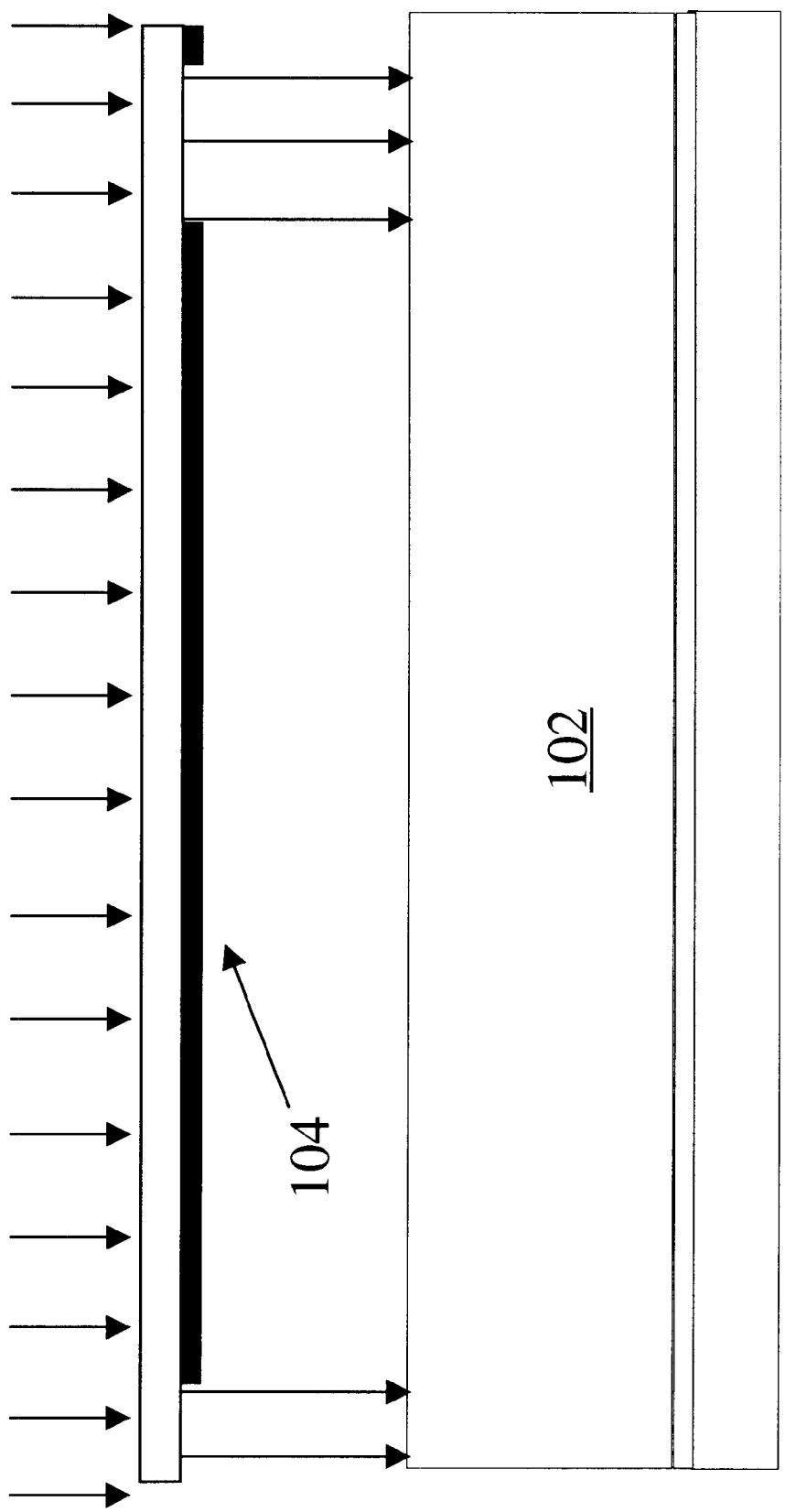

(3) Apply Thick Release Layer (e.g., x-ray photoresist): A thin photoresist 100 is spun on to cover the electrodes and provide an adhesive surface (FIG. 6c). Next, a thick release layer (e.g., x-ray sensitive photoresist) 102 such as a dry-film is applied (FIG. 6d). Thicknesses can be from 10s to 100s of microns. A low stress application method is critical to avoid pattern distortion. A lamination technique minimizes this stress. Stress free x-ray sensitive materials are purchased and glued to the substrate. Poly methyl methacrylate (PMMA) is a common x-ray sensitive photoresist, which can be purchased in sheets and laminated. PMMA is commonly called Plexiglas by Rohm and Hass or acrylic. The technology of thick film lamination to a substrate is well known in the art and has been covered by a number of authors, e.g. H. Guckel, T. Christenson, K. Skrobis "Formation of Microstructures using a preformed photoresist sheet", U.S. Pat. No. 5,576, 147, which is hereby incorporated by reference.

Figure 6F:
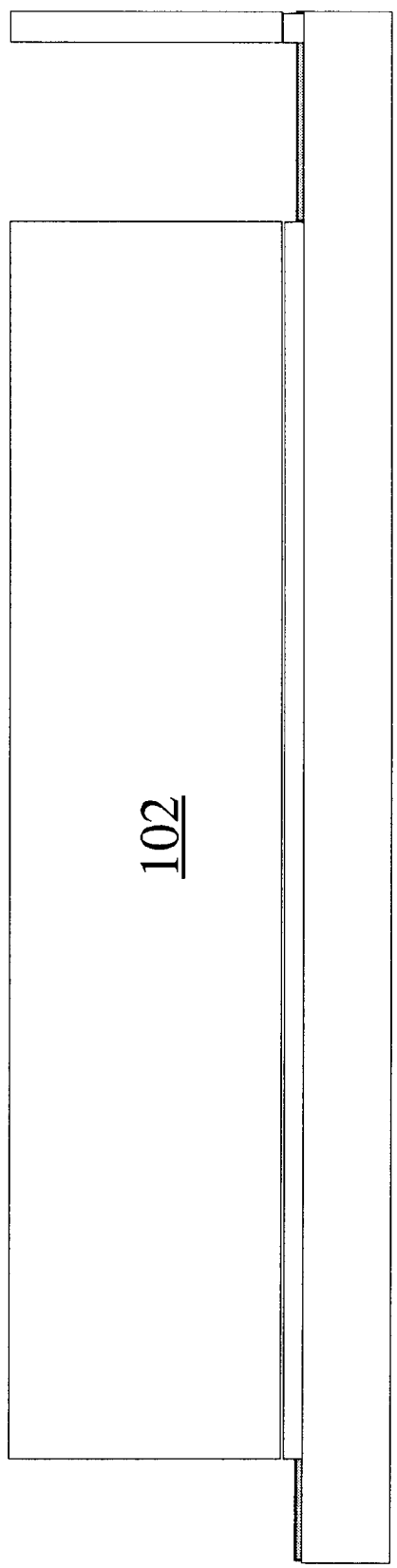

(4) Expose and Develop: An x-ray mask 104 containing the definition of the post array must then be aligned to the electrodes 92 already on the substrate. Alignment tolerances in the micron range are typically acceptable. Thick release 102 is exposed to synchrotron radiation x-rays through the mask (FIG. 6e) and developed. The development process will expose the conductive electrodes 92 (FIG. 6f).

Figure 6G:
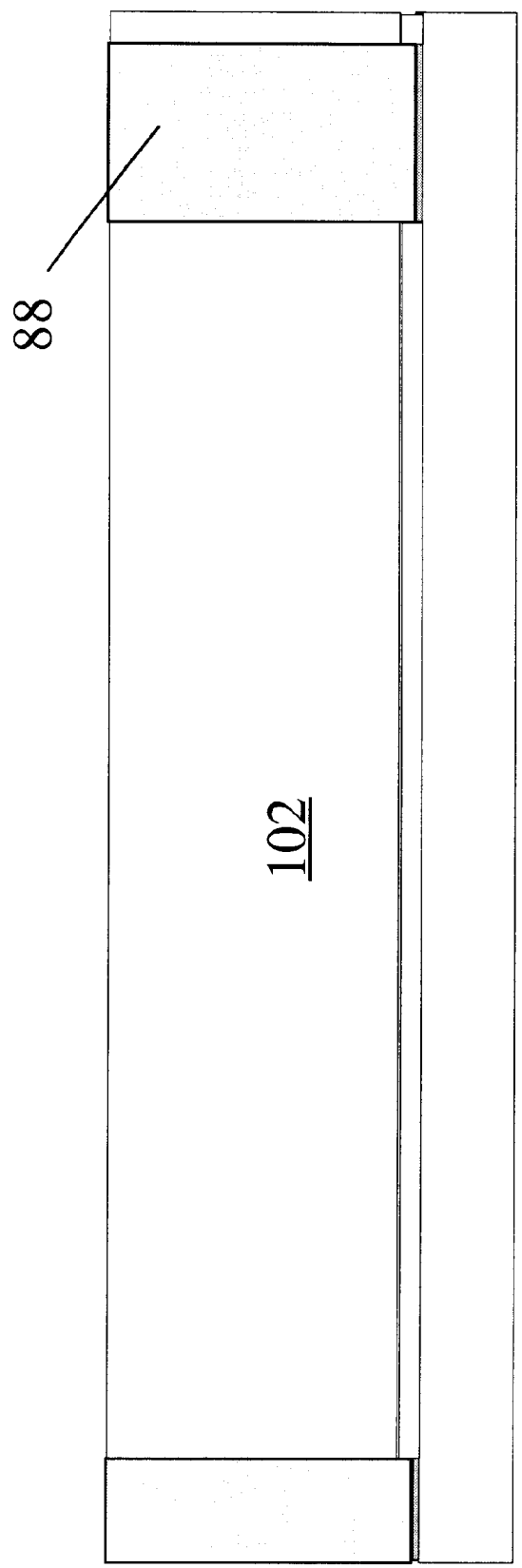

(5) Electroplate: Electrodeposition may then occur on the electrodes with the thick photoresist as the mold to form posts 88 (FIG. 6g). Nickel, iron, copper, gold, silver, and their alloys are common electroplated materials.

Figure 6H:
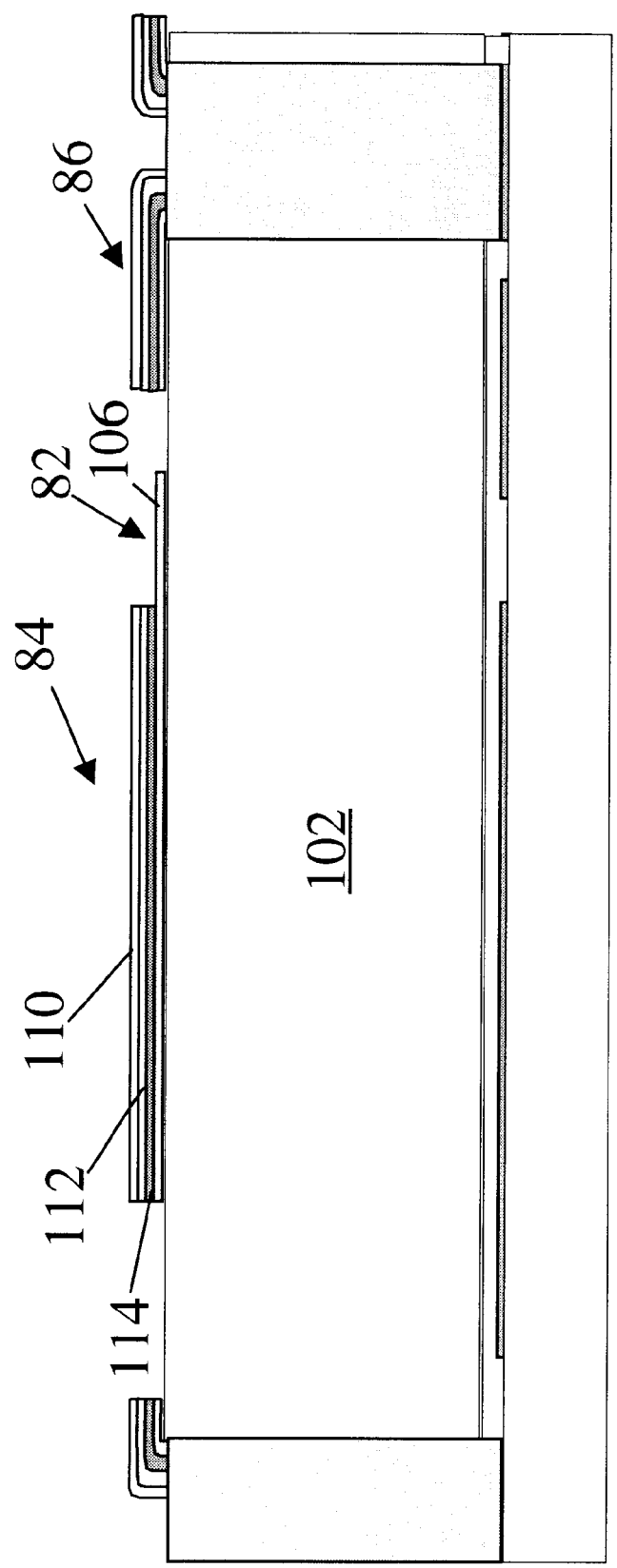
Figure 6I:
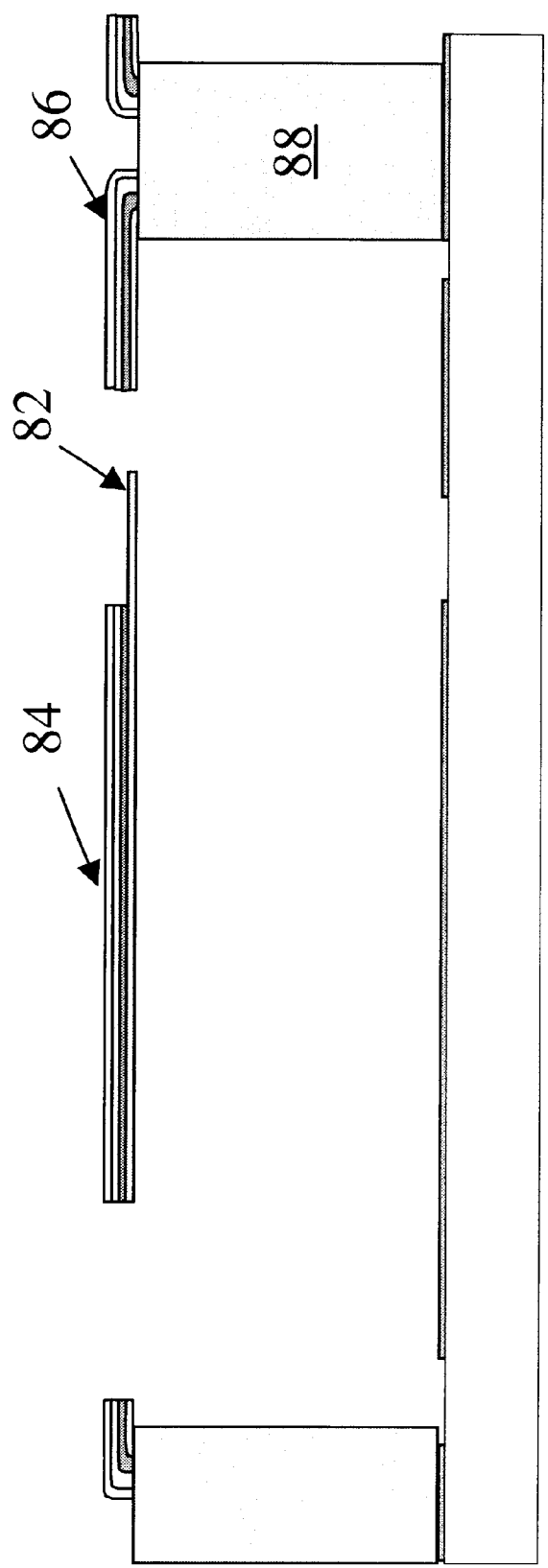

(6) Polish: Polish the surface of the metal posts 88 to form a sufficiently flat and smooth surface for surface micromachining (FIG. 6h).

(7) Surface Micromachine: Deposition and etching of one or more thin films to form frame 86, hinges 82 and mirrors 84 (FIG. 6i) as follows:

(7a) A support layer 106 is deposited and patterned from a material such as Silicon that is strong yet compliant (to define the frame and hinges), sufficiently conductive (to provide the conductive path necessary for electrostatic actuation), and does not exhibit a hysteresis (repeatable hinge response). Separate layers for the frame and hinges may be desirable depending upon the application. The hinges are preferably deposited with tensile stress to prevent buckling when the devices are released.

(7b) A mirror layer 108 is deposited and patterned from a material or materials that are reflective, strong and exhibit negligible stress gradient (to avoid curling the mirrors when released). For example, a composite mirror including a thin aluminum layer 110 on a structural layer of Silicon Nitride 112 would provide these properties.

In order to provide both a weak hinge and a stiff mirror, the mirror layer must be selectively etched in the presence of the hinge without damaging the hinge. This can be accomplished in a number of ways. With the layered structure shown and materials described above, the mirror layer must include an etch stop layer 114 such as aluminum to stop the Silicon Nitride etch from attaching the Silicon hinge material. As mentioned previously, the input fibers can be reconfigured such that the light beam strikes the underside of the mirror. In this case the support layer is etched away beneath the mirror and etch stop layer 114 also functions as the mirror surface so that the thin aluminum layer can be eliminated. Alternately, the support and mirror layers could be formed of materials such that the mirror etch does not attack the hinge layer. For example, a thick aluminum or gold mirror (no Silicon Nitride) would avoid this problem.

(8) Remove Thick Release Layer (e.g., x-ray photoresist):

The photoresist mold can then be dissolved using, for example, a dry release process (oxygen plasma) leaving the optical switch 70 suspended high above substrate 72.

While several illustrative embodiments of the invention have been shown and described, numerous variations and alternate embodiments will occur to those skilled in the art. Such variations and alternate embodiments are contemplated, and can be made without departing from the spirit and scope of the invention as defined in the appended claims.

We claim:

1. A method of fabricating MicroElectroMechanical Systems (MEMS) devices, comprising:

using a thick-film surface micromachining process to form a base on a substrate, the base including a thick release layer and an array of posts in patterned regions of the release layer, wherein the thick-film surface micromachining process comprises:

laminating a dry-film on the substrate, patterning the dry-film to expose selective regions of the substrate, and electroplating the patterned regions of the dry-film to form posts of the substrate;

using a thin-film surface micromachining process to form, a MEMS device on the thick release layer; and releasing the thick release layer leaving said MEMS device suspended on said posts above the substrate.

2. The method of claim 1, wherein the substrate includes integrated circuits that are connected via conductive traces, said thick-film and thin-film surface micromachining processes being accomplished at temperatures sufficiently low to avoid formation of an alloy between the conductive trace materials and the integrated circuit materials.

3. The method of claim 2, wherein said thick-film and thin-film surface micromachining processes are accomplished at temperatures less than 130° Celsius.

4. The method of claim 1, wherein the MEMS device includes a mechanical component, said release layer being sufficiently thick that said mechanical component is capable of moving through a full range of its intended motion without touching the substrate.

5. The method of claim 4, wherein said full range of motion is a rotation of at least ninety degrees.

6. The method of claim 1, wherein electrodes are patterned on the substrate prior to thick-film processing, said electrodes being exposed during patterning of the dry-film and then used during electroplating as a cathode to form the posts on those electrodes.

7. The method of claim 6, wherein said posts provide a conductive path between the MEMS devices suspended above said substrate and the electrodes on said substrate.

8. The method of claim 1, wherein the thin-film surface micromachining process comprises the following steps:

depositing and patterning a support layer from a material that is strong yet compliant enough to define a plurality of hinges, sufficiently conductive to provide a conductive path, and does not exhibit a hysteresis to ensure repeatable hinge response, and depositing and patterning a structural layer from a material that is strong yet low stress to define a plurality of flat conductive mechanical components that rotate about said hinges in response to an actuation force.

9. The method of claim 8, wherein the mechanical components are mirrors that respond to the actuation force communicated to the mirrors via the conductive paths.

10. The method of claim 8, wherein the mechanical components are sensors that communicate a signal via the conductive paths in response to the actuation force.

11. The method of claim 1, wherein the release layer is at least 10 microns thick and the MEMS device is at most 3 microns thick.

12. A method of fabricating MicroElectroMechanical Systems (MEMS) devices, comprising:

a thick-film surface micromachining process including laminating a dry-film onto a substrate, patterning the dry-film to expose the substrate and electroplating the patterned regions of the dry-film to form support posts on the substrate of a height substantially equal to that of the dry-film;

a thin-film surface micromachining process that forms a MEMS device on the dry-film;

a release process that removes the dry-film leaving said MEMS device suspended on the posts above the substrate.

13. The method of claim 12, wherein the thick-film process laminates a dry-film that is at least 10 microns thick and the thin-film process forms a MEMS device that is at most 3 microns thick.

14. The method of claim 12, wherein electrodes are patterned on the substrate prior to thick-film processing, said electrodes being exposed during patterning of the dry-film and then used during electroplating as a cathode to form the posts on those electrodes.

15. The method of claim 12, wherein the substrate includes integrated circuits that are connected via conductive traces, said thick-film and thin-film surface micromachining processes being accomplished at temperatures less than 130 degrees Celsius to avoid formation of an alloy between the conductive trace materials and the integrated circuit materials.

16. The method of claim 12, wherein the thin-film surface micromachining process comprises the following steps:

depositing and patterning a support layer from a material that is strong yet compliant enough to define a plurality of hinges, sufficiently conductive to provide a conductive path, and does not exhibit a hysteresis to ensure repeatable hinge response, and depositing and patterning a structural layer from a material that is strong yet low stress to define a plurality of flat conductive mechanical components that rotate about said hinges in response to an actuation force.

17. The method of claim 12, wherein the support layer is deposited in tensile stress.

18. The method of claim 12, further comprising the step of polishing the dry-film and posts prior to thin-film processing.

* * * * *